United States Patent
Kobayashi et al.

(10) Patent No.: US 8,148,240 B2
(45) Date of Patent: Apr. 3, 2012

(54) METHOD OF MANUFACTURING SEMICONDUCTOR CHIPS

(75) Inventors: Motoshige Kobayashi, Hyogo-ken (JP); Hideki Nozaki, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/545,573

(22) Filed: Aug. 21, 2009

(65) Prior Publication Data
US 2010/0048000 A1     Feb. 25, 2010

(30) Foreign Application Priority Data
Aug. 25, 2008     (JP) ................ P2008-215850

(51) Int. Cl.
*H01L 21/304*     (2006.01)
(52) U.S. Cl. .............. 438/463; 438/464; 257/E21.238
(58) Field of Classification Search ........... 438/463, 438/464
See application file for complete search history.

(56) References Cited

U.S. PATENT DOCUMENTS

| | | | |
|---|---|---|---|
| 6,399,463 B1* | 6/2002 | Glenn et al. | 438/463 |
| 2005/0255675 A1* | 11/2005 | Farnworth et al. | 438/460 |
| 2006/0292831 A1* | 12/2006 | Park | 438/460 |
| 2007/0087524 A1* | 4/2007 | Montgomery | 438/427 |
| 2008/0053972 A1* | 3/2008 | Otsu et al. | 219/121.62 |
| 2009/0042366 A1* | 2/2009 | Grivna | 438/460 |
| 2009/0209088 A1* | 8/2009 | Nagasawa | 438/462 |
| 2010/0173474 A1* | 7/2010 | Arita et al. | 438/462 |

FOREIGN PATENT DOCUMENTS

| | | |
|---|---|---|
| JP | 2006-253432 A | 9/2006 |
| JP | 2007-134454 A | 5/2007 |

* cited by examiner

*Primary Examiner* — Alexander Ghyka
*Assistant Examiner* — Stanetta Isaac
(74) *Attorney, Agent, or Firm* — Patterson & Sheridan, LLP

(57) ABSTRACT

A semiconductor wafer is prepared. The wafer has a first and a second surface opposite to each other, and has a recess portion and a rim portion. The semiconductor wafer has semiconductor elements formed on the first surface. The rim portion surrounds the recess portion. The recess portion and the rim portion are composed of the first and second surfaces. The recess portion is formed so as to recede toward the first surface. A tape is adhered to the second surface of the semiconductor wafer. At least the recess portion of the semiconductor wafer is placed on a stage. The tape is sandwiched between the recess portion and the stage. Laser beam is irradiated to the recess portion from the side of the first surface and along predetermined dicing lines. The recess portion is cut off to divide the semiconductor wafer into chips.

4 Claims, 5 Drawing Sheets

METHOD OF MANUFACTURING SEMICONDUCTOR CHIPS

CROSS REFERENCE TO RELATED APPLICATION

This application is based upon and claims the benefit of priority from the prior Japanese Patent Application No. 2008-215850, filed on Aug. 25, 2008, the entire contents of which are incorporated herein by reference.

FIELD OF THE INVENTION

The invention relates to a method of manufacturing semiconductor chips by dividing a semiconductor wafer.

DESCRIPTION OF THE BACKGROUND

An insulating gate bipolar transistor (Hereinafter referred to as "IGBT") is known as a switching element. The IGBT switches on or off a current flowing in a thickness direction of a semiconductor chip composing the IGBT. The semiconductor chip is required to be thinner in order to reduce the power loss when the switching element is in an ON state.

In a conventional method of manufacturing such a kind of switching element, a plurality of semiconductor elements are formed on a semiconductor wafer, and then a recess is formed on the back side of the semiconductor wafer in order to make a portion of the semiconductor wafer thinner. By forming the recess, a rim portion is formed at the peripheral area of the semiconductor wafer. Subsequently, a dicing tape is adhered to the back surface of the semiconductor wafer. Then, the semiconductor wafer is diced with a blade so that the semiconductor wafer is divided into a plurality of semiconductor chips.

When the dicing tape is adhered to the back surface of the semiconductor wafer, a connection portion, i.e. a corner portion, between the recess portion and the rim portion can be prevented from adhering to a base portion of the rim portion so that floating or separating of the dicing tape may occur partially. The floating or separating is caused due to existence of a step which is formed by forming the recess.

In addition, when the semiconductor wafer is set on a vacuum chuck stage before dicing, a clearance needs to be provided between the recess portion and the vacuum chuck stage, in consideration of likelihood of variation in the shape of the formed recess portion. The portion of the semiconductor wafer facing the clearance is not supported by the vacuum chuck stage so that chip cracking or chipping of the semiconductor wafer is likely to occur during dicing.

In Japanese Patent Application publication No. 2007-134454, a method of dicing a semiconductor wafer using a laser beam is disclosed.

According to the method, a plurality of elements is formed on a main surface of the semiconductor wafer. Slits are formed on a back surface of the semiconductor wafer by a mechanical or chemical process. The slits extend along dicing lines or chip dividing lines. Laser beam is radiated to the slits from below in order to produce a reformed layer, i.e. a property modified layer, in a portion of the semiconductor wafer deeper than the slits. The semiconductor wafer is divided starting from the position of the reformed layer as a starting point of cleavage. The divided semiconductor wafer is ground and removed up to a predetermined depth from the back surface.

According to the method, the laser beam is radiated to the slits along the dicing lines or the chip dividing lines in order to produce the reformed layer. As a result, occurrence of minute cracks can be prevented.

However, the patent publication does not show a method for preventing chip cracking or chipping of a semiconductor wafer, which is utilized when a recess portion is formed on a back surface of the semiconductor wafer.

SUMMARY OF THE INVENTION

An aspect of the present invention provides a method of manufacturing semiconductor chips including preparing a semiconductor wafer having a first and a second surface opposite to each other and having a recess portion and a rim portion, the semiconductor wafer having semiconductor elements formed on the first surface, the rim portion surrounding the recess portion, the recess portion and the rim portion being composed of the first and second surfaces, and the recess portion being formed so as to recede toward the first surface, applying a tape onto the second surface of the semiconductor wafer, placing at least the recess portion of the semiconductor wafer on a stage with the tape sandwiched between the recess portion and the stage, and radiating laser beam to the recess portion from the side of the first surface and along predetermined dicing lines to cut off the recess portion to divide the semiconductor wafer into chips.

An aspect of the present invention provides a method of manufacturing semiconductor chips including preparing a semiconductor wafer having a first and a second surface opposite to each other and having a recess portion and a rim portion, the semiconductor wafer having semiconductor elements formed on the first surface, the recess portion surrounding the rim portion, the recess portion and rim portion being composed of the first and second surfaces, the recess portion being formed so as to recede toward the first surface, applying a tape onto the semiconductor elements of the semiconductor wafer, placing the semiconductor wafer on a stage with the tape and the semiconductor elements sandwiched between the recess portion and the stage, the stage being larger in size than the semiconductor wafer, and radiating laser beam to the recess portion from the side of the second surface and along predetermined dicing lines to cut off the recess portion to divide the semiconductor wafer into chips.

DETAILED DESCRIPTION OF THE INVENTION

Figure 1A:
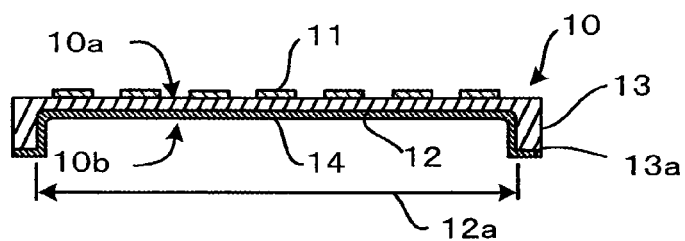
FIGS. 1A to 1D are cross sectional views showing steps of a method of manufacturing semiconductor chips according to a first embodiment of the invention.

Hereinafter, embodiments of the invention will be described with reference to the drawings. In the drawings, the same numerals indicate the same parts respectively.

A method of manufacturing semiconductor chips according to a first embodiment of the invention will be explained with reference to FIGS. 1A to 1D.

As shown in FIG. 1A, a semiconductor wafer 10, for example, a silicon wafer is prepared. The semiconductor wafer 10 has a diameter of 200 mm and a thickness of 700 μm. A plurality of semiconductor elements 11 are formed on a first surface 10a, i.e. a main surface, of the semiconductor wafer 10.

A circular recess portion 12 of a diameter 12a is formed to recede from a back side of the semiconductor wafer 10 opposite to the first surface 10a. A rim portion 13 is formed to project on the back side of the semiconductor wafer 10. The rim portion 13 surrounds the recess portion 12. The recess portion 12 and the rim portion 13 form the first surface 10a and a second surface 10b opposite to the first surface 10a.

The depth of the recess portion 12 is 50 to 100 μm. The rim portion 13 has an end surface 13a. The rim portion has a thickness of 700 μm and a width of 3 mm. The recess portion 12 is obtained by grinding the semiconductor wafer 10 until a central portion of the second surface 10b reaches a depth of 50 to 100 μm, so as to leave the peripheral portion by an approximately 3 mm width. The recess portion 12 may be obtained by a combination of grinding and removal processing to remove a crushed layer after the grinding.

A portion of the second surface 10b, which forms the recess portion 12, is flat. The recess portion 12 is thin so that the semiconductor wafer 10 can be diced without forming slits to facilitate cutting off along dicing lines or chip dividing lines.

A metal electrode film 14, which is to be cut off and used for electrodes of the semiconductor elements, is formed on a second surface 10b entirely.

Figure 1B:
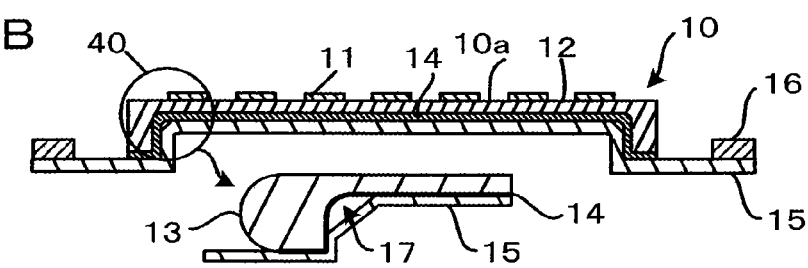

As shown in FIG. 1B, an adhesive tape 15 for dicing is adhered to the metal electrode film 14. The adhesive tape 15 is larger than the semiconductor wafer 10 in size. The outer peripheral portion of the adhesive tape 15 is held by a ring frame 16. The adhesive tape 15 may be prevented from adhering to a base portion of the rim portion so that floating or separating of the dicing tape may be produced partially.

Figure 1C:
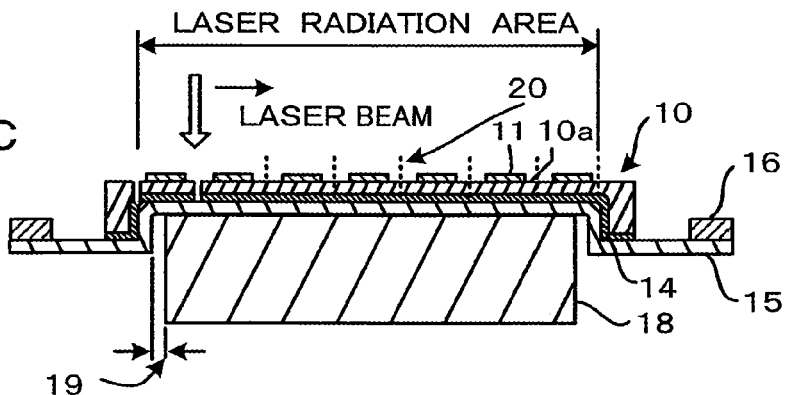

As shown in FIG. 1C, the semiconductor wafer 10 is drawn and fixed by a vacuum chuck stage 18. The vacuum chuck stage 18 has a diameter smaller than the recess portion 12. The upper portion of the vacuum chuck stage 18 is positioned inside the recess portion 12, and contacts with the recess portion 12. A clearance 19 is provided between the metal electrode film 14 formed on the surface of the rim portion 13 and the surface of the vacuum chuck stage 18 and in a lateral direction. The vacuum chuck stage 18 may have a portion extending toward the outer periphery to sustain an outer peripheral portion of the adhesive tape 15.

A laser beam is radiated toward the recess portion 12 from the side of the first surface 10a and along dicing lines 20 of the semiconductor wafer 10. By the irradiation with the laser beam, the semiconductor wafer 10 is cut off, and, as shown in FIG. 1D, is divided into a plurality of chips 21.

The laser beam may be radiated from a Q switch solid laser device of semiconductor laser beam excitation. The diameter of the laser beam may be squeezed to approximately 10 μm by using the solid laser device. The laser beam is radiated to the semiconductor wafer 10 once or several times to perform an ablation processing. The semiconductor wafer 10 is cut up to the tape 15 across the metal electrode film 14 by the ablation processing so that the semiconductor wafer 10 is fully cut.

Figure 1D:
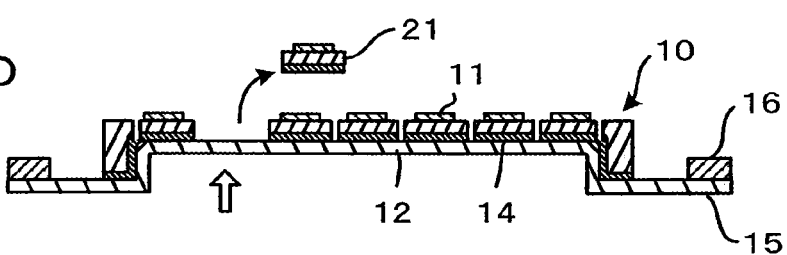

In FIG. 1D, the divided chips 21 are respectively picked up using a vacuum chuck (not drawn), for example. Each of the picked up chips 21 is placed on a chip tray, and is conveyed to a place for packaging.

The laser beam dicing, which employs laser beam radiation from the side with the first surface 10a as mentioned above, shows less mechanical shock and less thermal shock.

As a result, even if floating 17 or separating exists at a corner portion of the adhesive tape 15 and even if the clearance 19 exists between the metal electrode film 14 and the vacuum chuck stage 18, chip cracking or chipping may be prevented to occur.

Thus, the semiconductor wafer 10, which is provided with the recess portion to thin the semiconductor wafer 10, can be divided into the chips 21 precisely according to a predetermined chip shape.

In the embodiment, the tape 15 is adhered to the second surface 10b of the semiconductor wafer 10. The laser beam is irradiated from the side of the first surface 10a to perform dicing. Instead of using such steps, as a modification, the tape 15 may be adhered to the first surface 10a, and the laser beam may be irradiated from the side of the second surface 10b to execute dicing.

Figure 2A:
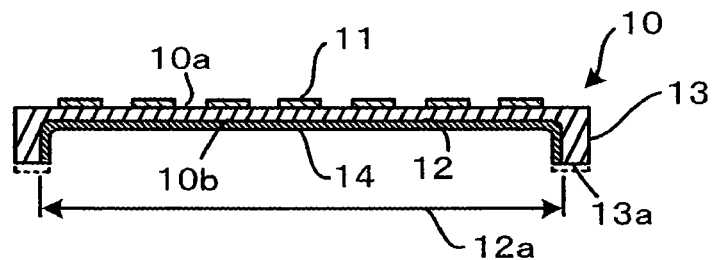
FIGS. 2A to 2C are cross sectional views showing main steps of a modification of the first embodiment.
Figure 2B:
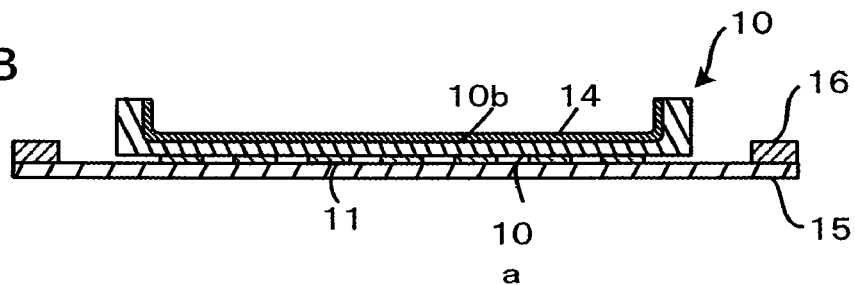
Figure 2C:
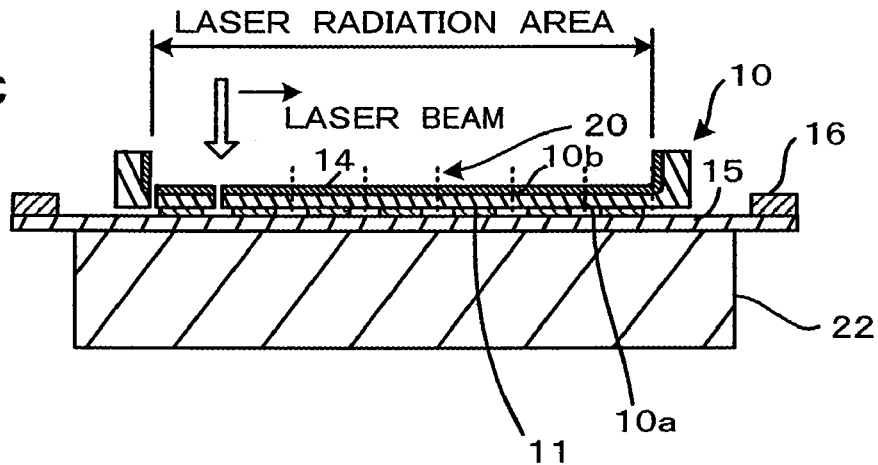

FIGS. 2A to 2C show the main steps of the modification in detail. As shown in FIG. 2A, a semiconductor wafer 10 is prepared. The semiconductor wafer has a first surface 10a and a second surface 10b. The semiconductor wafer has a rim portion 13. A portion of a metal electrode film 14, which is formed on an end surface 13a of a rim portion 13, is removed by lapping, for example, prior to dicing.

The portion of the metal electrode film 14 is removed because the metal electrode film 14 does not transmit infrared light. By removing the portion of the metal electrode film 14, infrared light can be detected, when the infrared light is radiated to the semiconductor wafer 10 from the side of the first surface 10a and is transmitted through the rim portion 13.

The position of the semiconductor wafer 10, in other words, the position of dicing lines 20 formed on the first surface 10a, can be recognized by the detected infrared light so that the laser beam may be directed to the recognized dicing lines 20.

Subsequently, as shown in FIG. 2B, an adhesive tape 15 is adhered to the first surface 10a of the semiconductor wafer 10.

As shown in FIG. 2C, the semiconductor wafer 10 is fixed to a vacuum chuck stage 22. The laser beam is radiated to the first surface 10a from the side of the second surface 10b and along the dicing lines 20. Cutting is performed from the metal electrode film 14 to the adhesive tape 15. A large portion of the semiconductor wafer 10, which is positioned within the width 12a of the recess portion 12, is cut fully.

According to the modification, the first surface 10a is flat so that floating or separating of the adhesive tape 15 can be prevented from occurrence. Furthermore, a clearance between the recess portion 12 and the vacuum chuck stage 22 is not necessary according to the modification, while the first embodiment requires the clearance 19 as shown in FIG. 1C. The modification presents better operability, and allows the semiconductor wafer 10, including the peripheral portion, to be diced into chips of a predetermined chip shape more concisely.

As the entire surface of the semiconductor wafer 10 is drawn by the vacuum chuck stage 22 which has a wider area than the semiconductor wafer 10, the semiconductor wafer 10 can be fixed more surely and stably.

In the modification, the portion of the metal electrode film 14 formed on the end surface 13a of the rim portion 13 is removed by lapping. Instead of the removing process, the modification may include forming a mask on the end face 13a of the rim portion 13, forming a metal electrode film on the second surface 10b and removing the mask on which a portion of the metal electrode film exists.

Figure 3A:
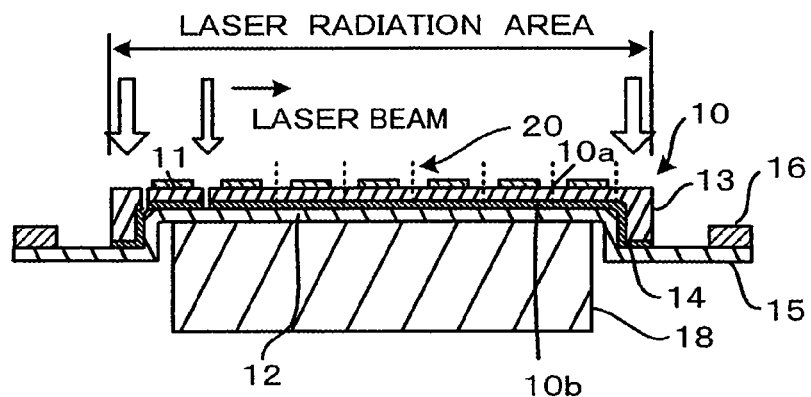
FIGS. 3A and 3B are cross sectional views showing main steps of a method of manufacturing semiconductor chips according to a second embodiment of the invention.
Figure 3B:
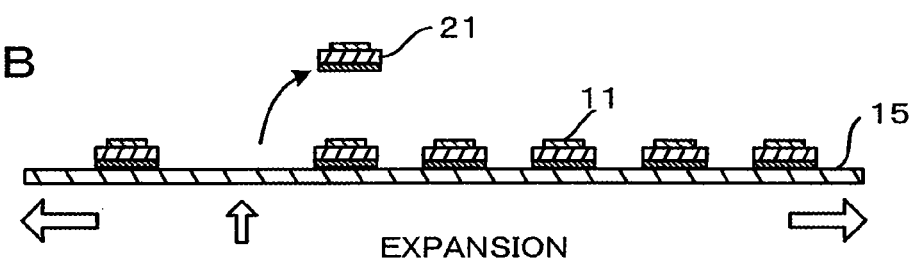

A method of manufacturing semiconductor chips according to a second embodiment of the invention will be explained with reference to FIGS. 3A and 3B. FIGS. 3A and 3B show main steps of the method.

In FIG. 3A, similarly to the step shown in FIG. 1C, a semiconductor wafer 10 is drawn and fixed to a vacuum chuck stage 18. The semiconductor wafer 10 has a first surface 10a and a second surface 10b. A laser beam is radiated to a recess portion 12 from the side of the first surface 10a so that the semiconductor wafer 10 is cut and divided within the width of the recess portion 12. A laser beam, which has a larger output than the laser beam radiated to the recess portion 12, is radiated to a rim portion 13. The larger output laser beam cuts the rim portion 13 across a metal electrode film 14 to an adhesive tape 15 so that the rim portion 13 is cut fully.

Subsequently, as shown in FIG. 3B, the adhesive tape 15 is expanded so that chips 21 are peeled off from each other. Then, each of the divided chips 21 is picked up and is placed on a chip tray. Further, each of the divided chips 21 is conveyed to a place for packaging.

In the embodiment, the rim portion 13 is irradiated with the laser beam in order to be cut. The adhesive tape 15 is expanded so that the chips 21 may be moved to spread in sufficient interval. As a result, the embodiment can give more allowance for positioning precision to pick up the chips so that the embodiment presents better operability.

In the embodiment, the laser beam is radiated from the side of the first surface 10a of the semiconductor wafer 10 to cut off the rim portion 13. Instead, as a modification, the laser beam may be radiated from the side of the second surface 10b to cut off the rim portion 13.

Figure 4:
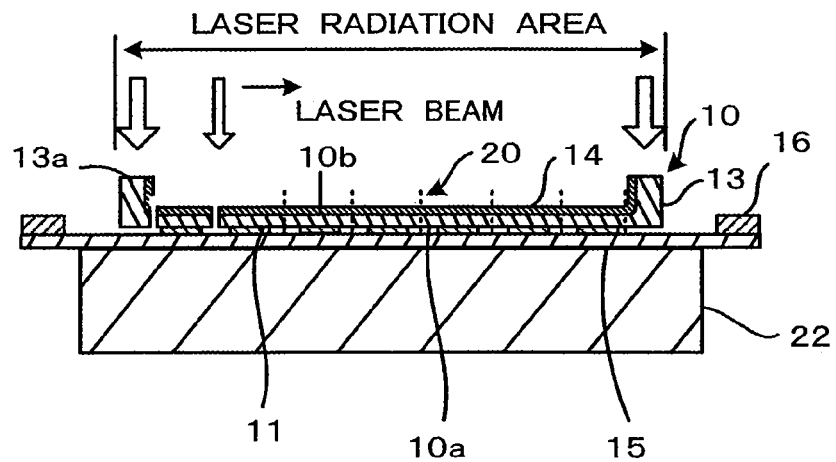
FIG. 4 is a cross sectional view showing main step of a modification of the second embodiment.

FIG. 4 shows the modification. In FIG. 4, similarly to the step shown in FIG. 2C, a semiconductor wafer 10 and a vacuum chuck stage 22 are provided. The semiconductor wafer 10 has a first surface 10a and a second surface 10b. A portion of a metal electrode film 14, which is formed on an end surface of a rim portion 13, is removed. Then, an adhesive tape 15 is adhered to the first surface 10a of the semiconductor wafer 10. A laser beam is irradiated from the side of the second surface 10b so that the rim portion 13 is cut off.

Figure 5A:
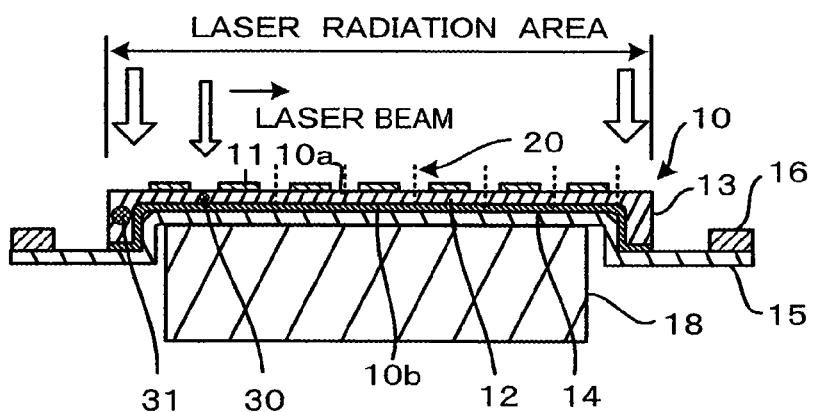
FIGS. 5A and 5B are cross sectional views showing main steps of a method of manufacturing semiconductor chips according to a third embodiment of the invention.
Figure 5B:
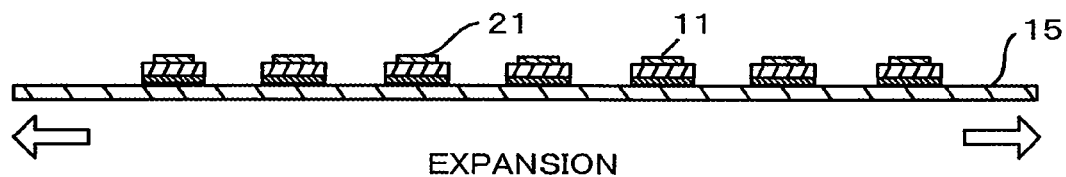

A method of manufacturing the semiconductor chips according to the third embodiment of the invention will be explained with reference to FIGS. 5A and 5B. FIGS. 5A and 5B show main steps of the method. In the embodiment, a reformed layer is formed inside a semiconductor wafer, and then an adhesive tape adhered to the semiconductor wafer is expanded to divide the same into chips.

In FIG. 5A, similarly to the step shown in FIG. 1C, an adhesive tape 15 is adhered to a semiconductor wafer 10a via a metal electrode layer 14. The semiconductor wafer 10 is drawn and fixed to a vacuum chuck stage 18. The semiconductor wafer 10 has a first surface 10a and a second surface 10b. Laser beam is radiated from a laser device, through the first surface 10a, to a recess portion 12. By the irradiation with the laser beam, a reformed layer 30, i.e. an amorphous layer, is formed inside a large area of the semiconductor wafer 10 positioned within the width of the recess portion 12.

Further, the output of the laser device is enhanced, and the enhanced laser beam is radiated from the laser device to a rim portion 13 so that a reformed layer 31 is formed inside the rim portion 13.

Subsequently, as shown in FIG. 5B, an adhesive tape 15 adhered to the semiconductor wafer 10 is expanded. The semiconductor wafer 10 is divided starting from the positions of the reformed layers 30, 31 as starting points of cleavage, by the expansion. The semiconductor wafer 10 is divided into chips 21.

In the embodiment, the reformed layers 30, 31 are formed inside the semiconductor wafer 10, and the adhesive tape 15 is expanded to divide the semiconductor wafer 10 into the chips 21. The embodiment may prevent producing scatters due to ablation, as the first embodiment. As a result, contamination of the semiconductor wafer 10 can be prevented, which presents better operability.

In the embodiment, the laser beam is radiated from the side of the first surface 10a of the semiconductor wafer 10 to form the reformed layers 30, 31. Instead, as a modification, the reformed layers 30, 31 may be formed by radiating laser beam from the side of the second surface 10b of the semiconductor wafer 10.

Figure 6A:
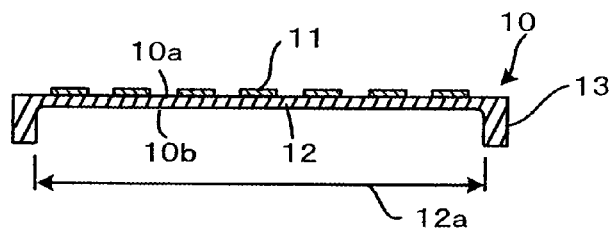
FIGS. 6A to 6D are cross sectional views showing main steps of a modification of the third embodiment.

FIGS. 6A to 6D are cross sectional views showing main steps of the modification. In FIG. 6A, a semiconductor wafer 10 is prepared. The semiconductor wafer 10 has a first surface 10a and a second surface 10b. A recess portion 12 is formed to recede from the side of the second surface 10b of the semiconductor wafer 10.

Figure 6B:
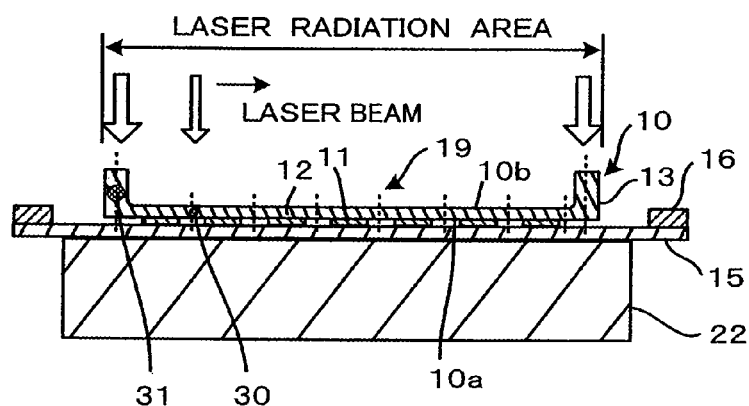

As shown in FIG. 6B, an adhesive tape 15 is adhered to the first surface 10a of the semiconductor wafer 10. The semiconductor wafer 10 is drawn and fixed to the vacuum chuck stage 22. From the side of the second surface 10b, a laser beam is radiated from a laser device to the recess portion 12. A reformed layer 30 is formed inside a large area of the semiconductor wafer 10 positioned within the width of the recess portion 12. Further, the output of the laser device is enhanced. The enhanced laser beam is irradiated to a rim portion 13. By the irradiation with the enhanced laser beam, a reformed layer 31 is formed inside the rim portion 13.

Figure 6C:
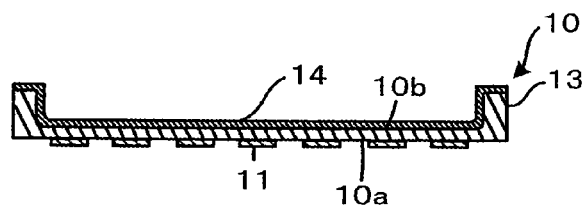

As shown in FIG. 6C, the semiconductor wafer 10 is detached from the vacuum chuck stage 22, and the adhesive tape 15 is peeled off. Then, the metal electrode film 14 is formed on the second surface 10b entirely.

Figure 6D:
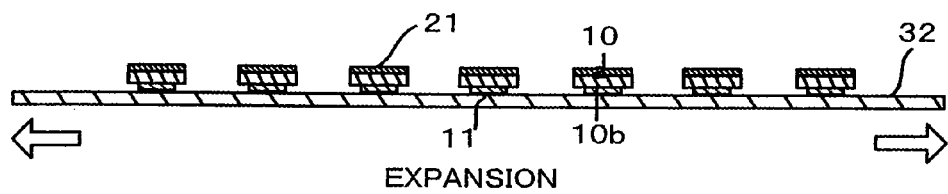

Subsequently, as shown in FIG. 6D, an adhesive tape 32 is adhered to the first surface 10a of the semiconductor wafer 10. The adhesive tape 32 is expanded to divide the semiconductor wafer 10 into chips 21.

In the modification, the laser beam is radiated to the semiconductor wafer 10 before forming the metal electrode film 14 so that the laser beam can enter the semiconductor wafer 10, avoiding reflection from the metal electrode film 14.

The methods of irradiating the laser beams described with reference to FIGS. 2A to 2C, 3A, 3B, 4, 5A and 5B may be applied to the modification shown in FIGS. 6A to 6D.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A method of manufacturing semiconductor chips comprising:
preparing a semiconductor wafer having a first and a second surface opposite to each other and having a recess portion and a rim portion, the semiconductor wafer having semiconductor elements formed on the first surface, the recess portion being surrounded by the rim portion, the recess portion and rim portion being composed of the first and second surfaces, the recess portion being formed so as to recede toward the first surface;

placing the semiconductor wafer on a stage;

radiating a laser beam to the recess portion along predetermined dicing lines;

forming a metal electrode film to cover the second surface after radiating the laser beam to the recess portion along the dicing lines;

applying a tape onto the semiconductor elements; and expanding the tape to cut off the recess portion so as to divide the semiconductor wafer into chips.

2. A method of manufacturing semiconductor chips according to claim 1, wherein the output of a laser beam radiated to the rim portion is larger than that of the laser beam radiated to the recess portion.

3. A method of manufacturing semiconductor chips comprising:

preparing a semiconductor wafer having a first and a second surface opposite to each other and having a recess portion and a rim portion, the semiconductor wafer having semiconductor elements formed on the first surface, the recess portion being surrounded by the rim portion, the recess portion and rim portion being composed of the first and second surfaces, the recess portion being formed so as to recede toward the first surface;

applying a tape to the first surface side of the semiconductor wafer where the semiconductor elements are formed and placing the semiconductor wafer on a stage while making the first surface face toward the stage;

radiating a laser beam from the second surface side to the recess portion along predetermined dicing lines;

forming a metal electrode film to cover the second surface after radiating the laser beam to the recess portion along the dicing lines;

applying a tape onto the semiconductor elements; and expanding the tape to cut off the recess portion so as to divide the semiconductor wafer into chips.

4. A method of manufacturing semiconductor chips according to claim 3, wherein the output of a laser beam radiated to the rim portion is larger than that of the laser beam radiated to the recess portion.

* * * * *